(12) United States Patent
Barkley

(10) Patent No.: US 7,532,515 B2
(45) Date of Patent: May 12, 2009

(54) VOLTAGE REFERENCE GENERATOR USING BIG FLASH CELL

(75) Inventor: Gerald Barkley, Oregon, WI (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 11/803,362

(22) Filed: May 14, 2007

(65) Prior Publication Data

US 2008/0285339 A1  Nov. 20, 2008

(51) Int. Cl.
*G11C 11/34* (2006.01)

(52) U.S. Cl. .............. 365/185.2; 327/540; 327/535; 327/537; 327/538; 323/313; 323/314; 323/315; 323/316

(58) Field of Classification Search .............. 365/185.2; 327/540, 535, 537, 538; 323/312–316
See application file for complete search history.

(56) References Cited

U.S. PATENT DOCUMENTS

| | | | |
|---|---|---|---|
| 5,172,338 A | 12/1992 | Mehrotra et al. | |
| 5,339,272 A | 8/1994 | Tedrow et al. | |
| 5,508,958 A | 4/1996 | Fazio | |
| 5,608,669 A | 3/1997 | Mi et al. | |
| 5,748,534 A | 5/1998 | Dunlap et al. | |
| 5,768,188 A | 6/1998 | Park | |
| 5,892,727 A | 4/1999 | Nakagawa | |
| 5,946,258 A | 8/1999 | Evertt et al. | |
| 5,953,256 A * | 9/1999 | Briner | 365/185.3 |
| 6,009,040 A | 12/1999 | Choi et al. | |
| 6,014,330 A | 1/2000 | Endoh et al. | |
| 6,118,701 A | 9/2000 | Uekubo | |
| 6,181,599 B1 | 1/2001 | Gongwer | |
| 6,333,885 B1 | 12/2001 | Bedarida et al. | |
| 6,396,739 B2 | 5/2002 | Briner | |
| 6,462,988 B1 | 10/2002 | Harari | |
| 6,559,710 B2 | 5/2003 | Matsuoka | |
| 6,586,985 B1 | 7/2003 | Romas, Jr. et al. | |
| 6,603,702 B2 | 8/2003 | Kojima | |
| 6,697,282 B1 * | 2/2004 | Keeney et al. | 365/185.2 |
| 6,731,540 B2 | 5/2004 | Lee et al. | |
| 6,798,278 B2 | 9/2004 | Ueda | |
| 6,806,762 B2 | 10/2004 | Stair et al. | |
| 6,870,766 B2 | 3/2005 | Cho et al. | |
| 6,970,037 B2 | 11/2005 | Sakhuja et al. | |
| 7,054,197 B2 | 5/2006 | Vimercati | |
| 7,092,295 B2 | 8/2006 | Iwase et al. | |
| 7,106,626 B2 | 9/2006 | Goldman et al. | |
| 7,116,597 B1 | 10/2006 | Goldman et al. | |

(Continued)

FOREIGN PATENT DOCUMENTS

EP  1071094  1/2001

(Continued)

*Primary Examiner*—Huan Hoang
*Assistant Examiner*—Fernando N Hidalgo
(74) *Attorney, Agent, or Firm*—Dana B. LeMoine; LeMoine Patent Services, PLLC

(57) ABSTRACT

A voltage reference generator includes multiple closed loop voltage references. Each of the closed loop voltage references uses a flash cell with a variable threshold voltage and a feedback loop to trim a reference voltage. The voltage reference generator includes sample and hold capacitors in output stages to allow reference voltages to be refreshed during a standby mode of operation.

6 Claims, 4 Drawing Sheets

U.S. PATENT DOCUMENTS

| | | |
|---|---|---|
| 7,176,751 B2 | 2/2007 | Giduturi et al. |
| 2002/0053944 A1 | 5/2002 | Brass et al. |
| 2002/0105835 A1 | 8/2002 | Pasotti et al. |
| 2003/0002334 A1 | 1/2003 | Chang |
| 2003/0021152 A1 | 1/2003 | Le et al. |
| 2004/0136237 A1 | 7/2004 | Banks |
| 2005/0018488 A1 | 1/2005 | Kim et al. |
| 2005/0265073 A1 | 12/2005 | Chae et al. |
| 2006/0114054 A1 | 6/2006 | Giduturi et al. |
| 2006/0132114 A1* | 6/2006 | Giduturi et al. ............. 323/313 |
| 2007/0076473 A1 | 4/2007 | Giduturi |
| 2007/0171708 A1 | 7/2007 | Tedrow et al. |

FOREIGN PATENT DOCUMENTS

| | | |
|---|---|---|
| EP | 1071094 A1 | 1/2001 |
| EP | 1467377 | 10/2004 |
| GB | 2332766 | 6/1999 |
| WO | WO-2007078885 A2 | 7/2007 |

* cited by examiner

VOLTAGE REFERENCE GENERATOR USING BIG FLASH CELL

FIELD

The present invention relates generally to electronic circuits, and more specifically to voltage reference circuits.

BACKGROUND

Some voltage reference circuits generate an output voltage that is referenced to a value of a circuit element such as a resistor. Varying the output voltage may be performed by varying the value of the circuit element. A resistor may be placed on an integrated circuit die, but these types of resistors tend to be imprecise. A precision resistor may be placed outside an integrated circuit, but this may take up space.

DESCRIPTION OF EMBODIMENTS

Figure 1:
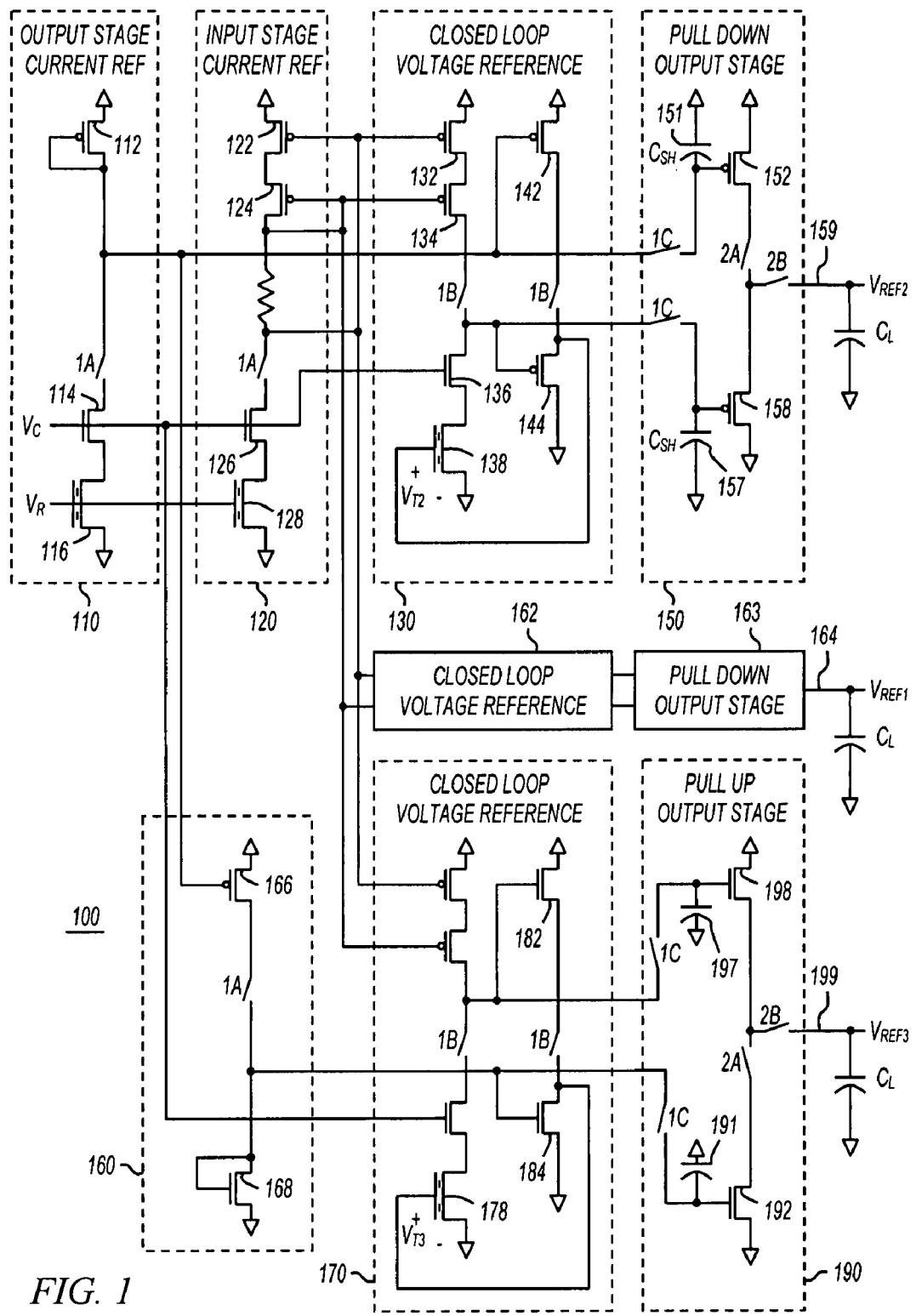
FIG. 1 shows a voltage reference generator using big flash cells.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a voltage reference generator using big flash cells. Voltage reference generator 100 includes output stage current reference circuit 110, input stage current reference circuit 120, current mirror circuit 160, closed loop voltage reference circuits 130, 162, and 170, and output stages 150, 163, and 190. In operation, closed loop voltage references 130, 162, and 170 generate reference voltages, and output stages 150, 163, and 190 provide output voltages matching the reference voltages with an open loop response at nodes 159, 164, and 199, respectively. In some embodiments, the three reference voltages ($V_{REF2}$, $V_{REF1}$, $V_{REF3}$) are multiplexed onto a wordline in a memory device to create a "spiral" voltage waveform. An example spiral voltage waveform is described below with reference to FIG. 2.

Each of the circuits shown in FIG. 1 include switches that may be opened to reduce current flow and save power. For example, switches labeled 1A, 1B, 1C, 2A, and 2B are shown in FIG. 1. The operation of the voltage reference generator 100 is first described with all of the switches closed. Low power operation is then described in which the switches are opened in a sequence that preserves reference voltage values while reducing power consumption.

Closed loop voltage reference circuits 130, 162, and 170 are "trimmable" voltage reference circuits. For example, each of voltage reference circuits 130, 162, and 170 includes floating gate transistors having programmable threshold voltages, that when programmed to various values, "trim" the reference voltages. The floating gate transistors are used as reference devices, in that the output voltages generated by the reference voltage generators are a function of the programmed threshold voltages.

The operation of closed loop voltage reference circuit 130 is now described. Voltage reference circuit 130 includes flash cell 138, and isolated gate transistors 136, 144, 132, 134, and 142. Voltage reference circuit 130 includes an input stage and an output stage. The input stage includes flash cell 138 and transistors 136, 132, and 134. The output stage includes transistors 144 and 142. The output stage is coupled to the input stage as part of a feedback loop in a unity gain configuration. Transistors 132 and 134 are part of a current source for the input stage, and transistor 142 is part of a current source for the output stage.

Flash cell 138 is an example of a floating gate transistor having a variable threshold voltage ($V_{T2}$). The threshold voltage of flash cell 138 may be modified by changing the amount of charge stored on the floating gate of flash cell 138. This may also be referred to as "programming" flash cell 138. Flash cell 138 may be programmed with programming circuitry (not shown) useful for programming floating gate transistors.

As used herein, the term "threshold voltage current" refers to the current that flows through a transistor when a voltage of substantially $V_T$ appears across the control terminals of the transistor, and the drain voltage is set to a nominal value. For example, the threshold voltage current of an NMOS transistor is equal to the drain-to-source current of the transistor when the gate-to-source voltage is substantially $V_T$. Also for example, the threshold voltage current ($I_{VT}$) of flash cell 138 flows from drain to source when the gate-to-source voltage on flash cell 138 is substantially $V_{T2}$.

Isolated gate transistor 136 is coupled between current source of the input stage and flash cell 138 in a cascode configuration. The gate node of transistor 136 is driven with a bias voltage ($V_C$). $V_C$ is a voltage that is chosen to provide a suitable drain voltage on the drain of flash cell 138. For example, in some embodiments, $V_C$ is chosen to provide a drain voltage of between about 0.7 volts and 1.2 volts. In some embodiments, $V_C$ is set once and is static thereafter. For example, $V_C$ may be provided by an on-chip voltage reference that remains static. In other embodiments, $V_C$ may be provided by a variable voltage reference circuit, so that the drain voltage on flash cell 138 may be modified.

Transistor 144 is coupled as a "source follower," which provides low output impedance to drive relatively large capacitive loads easily. The gate node of transistor 144 is coupled to the drain node of transistor 136 to receive a voltage that is influenced by flash cell 138. The drain node of transistor 144 is coupled to a power supply node (which may be "ground"), and the source node of transistor 144 is fed back to the gate node of flash cell 138. In some embodiments, source follower transistor 144 is operated in the sub-threshold region where the transconductance ($g_m$) of the transistor is proportional to the drain current. This operation is in contrast to operation in the inversion saturation region where $g_m$ is proportional to the square-root of the drain current. In other words, in the sub-threshold region of operation, the value of $g_m$ is higher for a given drain current. The output impedance of the source follower stage is equal to $1/g_m$ of transistor 144, and may be adjusted by choosing the size of source follower transistor 144 and the drain current provided by current source transistor 142.

The input stage current source (transistors 132, 134) provides a drain current ($I_{VT}$) substantially equal to the threshold voltage current of flash cell 138. The operation of the feedback loop in combination with current $I_{VT}$ forces the gate-to-source voltage of flash cell 138 to be substantially $V_{T2}$, which may vary based on how flash cell 138 has been programmed.

In some embodiments, flash cell 138 is programmed to perform offset voltage correction. Voltage offsets of the various circuit components may be trimmed out of the circuit by modifying the threshold voltage of flash cell 138 until the desired output voltage is obtained.

In some embodiments, flash cell 138 is manufactured with dimensions larger than the minimum dimensions available in a particular manufacturing process. For example, the width of the gate area, the length of the gate area, or both, may be larger than the minimum dimension available. In some embodiments, the gate area of flash cell 138 is a few times larger than the minimum area possible. In other embodiments, the gate area of flash cell 138 is over one hundred times larger than the minimum area possible. In still further embodiments, the gate area of flash cell 138 is over one thousand times larger than the minimum gate area. A larger gate area may provide greater $V_T$ stability over time, in part because a larger amount of charge may be stored on a larger floating gate within flash cell 138.

Pull down output stage 150 includes transistors 152 and 158, and capacitors 151 and 157. Capacitors 151 and 157 are part of sample and hold circuits described further below. Transistor 152 is a current source transistor that receives the same gate voltage as transistor 142. Transistor 158 is an open loop source-follower transistor that receives the same gate voltage as source-follower transistor 144. Transistor 158 is not part of the feedback loop like transistor 144, and is free to respond more rapidly to voltage changes. The source node of transistor 158 is coupled to provide the reference voltage $V_{REF2}$ on node 159 at the junction between current source transistor 152 and source-follower transistor 158.

P-channel source-followers may be advantageously used to pull down the output node much faster when the initial voltage is higher than the nominal voltage. With the gate voltage fixed, the initial source-to-gate voltage of the source follower transistor will be higher than its nominal value and it can pull down the output voltage very strongly to the nominal value.

In some embodiments, current source transistors 142 and 152 are designed to source the same current value. Also in some embodiments, transistors 144 and 158 are matched devices that exhibit substantially the same operating characteristics. In embodiments represented by FIG. 1, transistors 144 and 158 are driven by a common gate voltage. In these embodiments, if transistors 144 and 158 are matched, and the two load currents provided by current source transistors 142 and 152 are matched, the output voltage $V_{REF2}$ will be substantially equal to the threshold voltage $V_{T2}$ of flash cell 138. With the gate voltage of transistor 158 held fixed by the closed loop configuration, transistor 158 may respond very fast and may be able to pull down any voltage on output node 159 to the $V_{REF2}$ voltage value without disrupting the operation of the feedback loop.

In some embodiments, $V_{REF2}$ on node 159 may be a voltage that is different from the threshold voltage of flash cell 138. For example, a voltage divider may be included in the feedback path between transistor 144 and 138. Further, transistors 144 and 158 may be unmatched, or current source transistors 142 and 152 may be unmatched, or both. By intentionally mismatching current sources or transistors, $V_{REF2}$ may be a voltage offset from $V_{T2}$.

Voltage reference generator 100 also includes two current reference circuits: current reference circuit 120 to provide a reference for the closed loop voltage reference input stages; and current reference circuit 110 to provide a reference for the source-follower stages and output stages. Both current reference circuits may make use of similar circuit topologies. For example, both current reference circuits 110 and 120 generate reference currents using flash cells (116 and 128) having gates driven with reference voltages. Flash cells 116 and 128 are programmed to have threshold voltages equal to the reference voltages driving their respective gates. In the example of FIG. 1, flash cells 116 and 128 are programmed to have a threshold voltage of $V_R$, and the gate nodes of flash cells 116 and 128 are driven with a voltage of $V_R$. Though flash cells 116 and 128 are shown being driven with the same gate voltage, this is not a limitation of the present invention. For example, in some embodiments, flash cells 116 and 128 may be different by different gate voltages, and may be programmed to have different threshold voltages.

Closed loop voltage reference 130 includes transistors 132 and 134, which mirror the reference current generated by input stage current reference circuit 120, and closed loop voltage reference 130 also includes transistor 142 which mirrors the reference current generated in output stage current reference circuit 110. Closed loop voltage references 162 and 170 also include transistors corresponding to transistors 132, 134, and 142. In these embodiments, current reference circuits 110 and 120 provide common control voltages to current sources within close loop voltage references 130, 162, and 170, and the current reference circuits are shared among the various reference voltage generators.

Closed loop voltage reference 162 includes circuitry similar to closed loop voltage reference 130, and pull down output stage 163 includes circuitry similar to pull down output stage 150. Closed loop voltage reference 162 includes a flash cell with a programmable threshold voltage, and VREF1, the output voltage of pull down output stage 163, can be made substantially equal to that threshold voltage as described above with reference to the operation of closed loop voltage reference 130.

Current reference circuit 160 includes transistors 166 and 168. Transistor 166 is a PMOS transistor that receives a reference voltage from output current reference circuit 110, and produces a reference voltage to drive NMOS transistors.

Closed loop voltage reference 170 includes flash cell 178 programmed to have a threshold voltage of $V_{T3}$. Closed loop voltage reference 170 also includes transistor 182 coupled in a source follower arrangement with current source transistor 184 providing a drain-to-source current for transistor 182. The source follower circuit of transistor 182 and current source transistor 184 are coupled to flash cell 178 in a unity gain feedback configuration as described above with reference closed loop voltage reference 130.

The operation of closed loop voltage reference 170 is similar to the operation of closed loop voltage reference 130 except that transistors 182 and 184 are n-channel devices rather than p-channel devices. N-channel source-followers may be advantageously used to pull up the output node when the initial voltage is lower than the nominal voltage. With the gate voltage fixed, the initial gate-to-source voltage of the source follower transistor will be higher than its nominal value and it can pull up the output voltage very strongly to the nominal value.

In some embodiments, voltage reference generator 100 may be used to drive wordlines of flash memory cells in multi-level cell (MLC) memory devices. For example, a voltage reference generator may be used to drive wordlines of flash memory cells that can have two or more states corresponding to different threshold voltage levels. To read the cell, the wordline may be driven with a "spiral" waveform, and multiple sensing operations may take place. Although voltage reference generator 100 outputs voltages from three closed loop voltage references, any number of closed loop voltage references may be included in a voltage reference generator without departing from the scope of the present invention.

Figure 2:
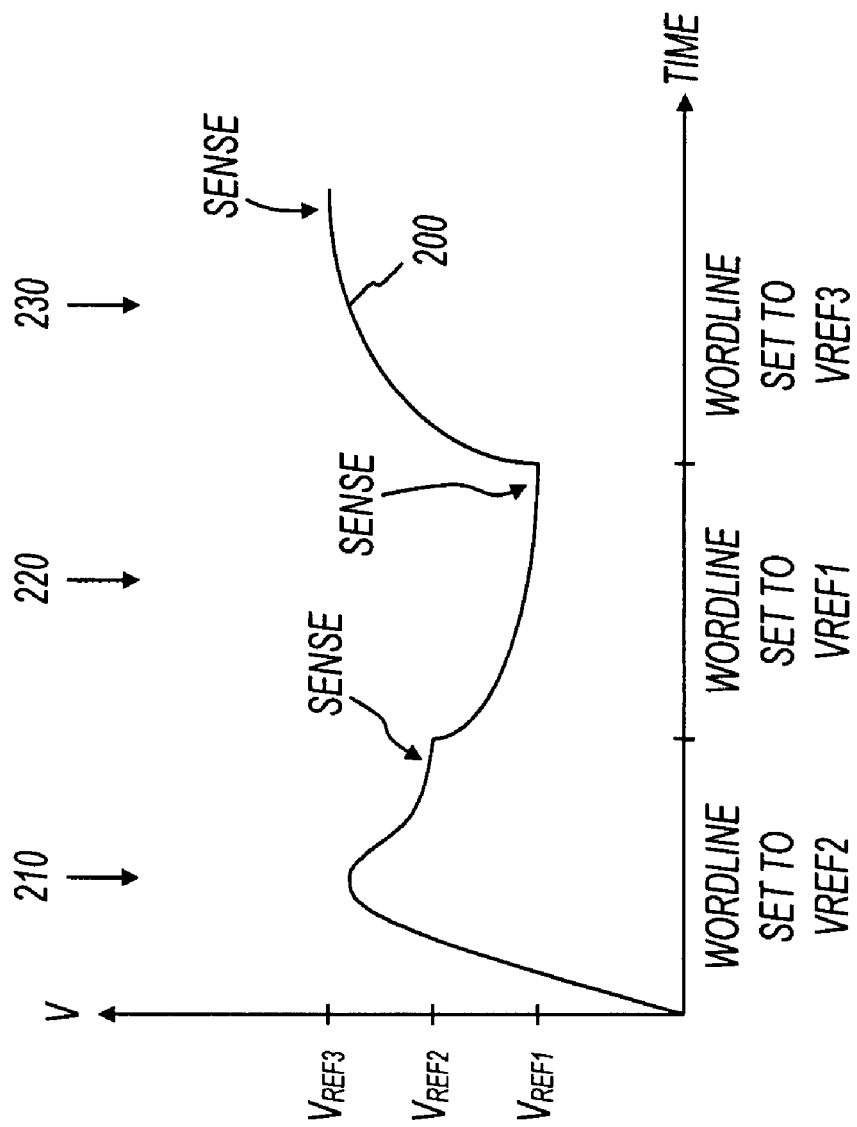
FIG. 2 shows a spiral voltage waveform output from the voltage reference generator of FIG. 1.

FIG. 2 shows a "spiral" voltage waveform. Spiral voltage waveform 200 steps first to an intermediate voltage $V_{REF2}$, then to a lower voltage $V_{REF1}$, and then to a higher voltage $V_{REF3}$. Spiral voltage waveform 200 may be generated by voltage reference generator 100 (FIG. 1). For example, at 210, spiral voltage waveform 200 corresponds to a multiplexer selecting the voltage on node 159 ($V_{REF2}$) to be output; at 220, spiral voltage waveform 200 corresponds to a multiplexer selecting the voltage on node 164 ($V_{REF3}$) to be output; and at 230, spiral voltage waveform 200 corresponds to a multiplexer selecting the voltage on node 199 ($V_{REF2}$) to be output.

When spiral voltage waveform 200 is used to drive a wordline in a memory for multi-level sensing, a sensing operation may occur as the voltage settles to a pre-determined value within areas 210, 220, and 230. For example, in some embodiments, a sensing operation may take place when the stepped waveform is within a few percent of its final value (e.g., $V_{REF2}$, $V_{REF1}$, or $V_{REF3}$). As described above with reference to FIG. 1, the values of $V_{REF3}$, $V_{REF2}$, and $V_{REF1}$ may be trimmed by programming a threshold voltage of a floating gate transistor within each of the closed loop voltage references within the voltage reference generator.

Memory devices that include voltage reference generator 100 (FIG. 1) may have a "standby" mode that consumes less power. Various circuits may be turned off within the voltage reference generator to reduce current consumption during standby mode. It may be desirable to have the reference voltage levels available very quickly, however, even in when in standby mode. For example, the reference voltage levels ($V_{REF1}$, $V_{REF2}$, $V_{REF3}$) may need to be accurate and available within ~10 ns of a read request. This can be accomplished by having the different voltage reference levels available during standby using a low power sample and hold (S/H) scheme as described below.

Output stage 150 includes sample and hold capacitors 151 and 157, and output stage 190 includes sample and hold capacitors 197 and 191. The discussion of output stage 150 also applies to output stage 163. Each of the output nodes also includes a capacitor shown as $C_L$. The $C_L$ capacitors are the voltage references that extend to the wordline in the memory device. These are sampled and held with the highest frequency because the leakage on the nodes is large and the voltage tolerance is small. The size of $C_L$ capacitor is determined to meet read window budget (RWB) requirements and standby power requirements. $C_L$ affects RWB because it needs to be large enough to dominate charge sharing that occurs when the voltage references are switched into a different potential. Once the RWB component is acceptable for sizing $C_L$, the refresh rate duty cycle is used to determine the standby power. A larger duty cycle means more standby power but better RWB. In other words, the voltage tolerance is inversely proportional to standby current.

The sample and hold capacitors ($C_{SH}$) capacitors are utilized during read to reduce active or read current and they are also utilized to lower standby current. Use of $C_{SH}$ reduces read current because the output stage current reference circuit, input stage current reference circuit and closed loop voltage references do not have to be on during a read. $C_{SH}$ reduces standby current because they do not have to be refreshed or powered up each time $C_L$ is refreshed. The charge is developed across $C_{SH}$ during power-up and sustained in standby and active modes. The size of $C_{SH}$ is determined to prevent a large coupling ratio and meet standby power specs.

Figure 3:
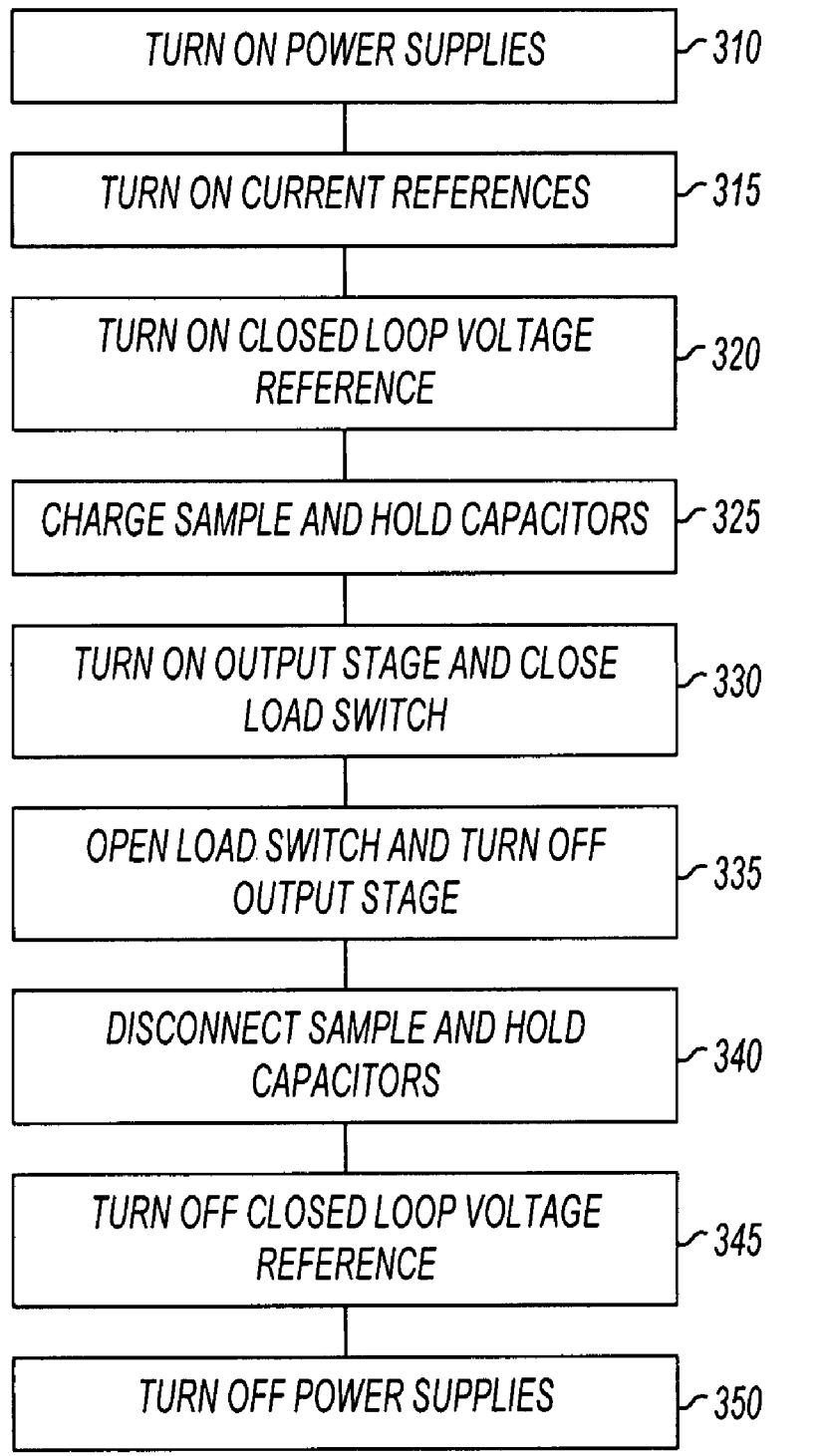
FIG. 3 shows a flowchart in accordance with various embodiments of the present invention.

The switches shown in FIG. 1 are opened and closed in a sequence. The sequencing or switching of the capacitors is important to make sure all of these nodes are within tolerance so that the selected wordline resolves data accurately within ~10 ns. FIG. 3 describes this switching sequence.

FIG. 3 shows a flowchart in accordance with various embodiments of the present invention. In some embodiments, method 360, or portions thereof, is performed within an MLC memory device to refresh reference voltages used to create a spiral wordline waveform. In other embodiments, method 300 is performed by a control circuit, an integrated circuit, or an electronic system. Method 300 is not limited by the particular type of apparatus or software performing the method. The various actions in method 300 may be performed in the order presented, or may be performed in a different order. Further, in some embodiments, some actions listed in FIG. 3 are omitted from method 300.

Method 300 is shown beginning with block 310 in which power supplies are turned on. During standby operation, the power supplies that provide power to the voltage reference generator may be turned off to conserve power. The acts of block 310 correspond to power being applied to the voltage reference generator.

At 315, the current references are turned on. This corresponds to closing switches 1A within current references 110 and 120, and waiting for the circuits to stabilize. At 320, the closed loop voltage reference is turned on by closing switches 1B, and waiting for the circuit to stabilize. In some embodiments, each closed loop voltage reference is turned on at the same time, and in other embodiments, each closed loop voltage reference is turned on in sequence.

At 325, sample and hold capacitors within output stages are charged by closing switches 1C. Before the sample and hold capacitors are fully charged, (a few microseconds depending on circuit specifics), the output stage is turned on at 330 by closing switches 2A. The load switch 2B is also closed at 330 to charge the load capacitor $C_L$.

After the load capacitor is charged, the reference voltage is "refreshed." The remainder of method 300 corresponds to an orderly shut down of the circuits that were turned on to accomplish the refresh. At 335, the load switch 2B is opened, and the output stage is turned off by opening switch 2A. At 340, switches 1C are opened to isolate sample and hold capacitors in the output stage. At this point, the gate nodes of the current source transistor and source follower transistor in the output stage have substantially constant gate voltages. At 345, the closed loop voltage reference is turned off by opening switches 1B, and at 350, the power supplies are turned off.

In embodiments in which the closed loop voltage references are turned on in sequence rather than at the same time, the actions in blocks 320-345 are repeated for each reference voltage while the power supplies are on and the current references are stable. In embodiments in which all closed loop references are turned on and reference voltages are refreshed simultaneously, the power supplies may be turned off right after isolating the sample and hold capacitors by opening switches 1C.

Figure 4:
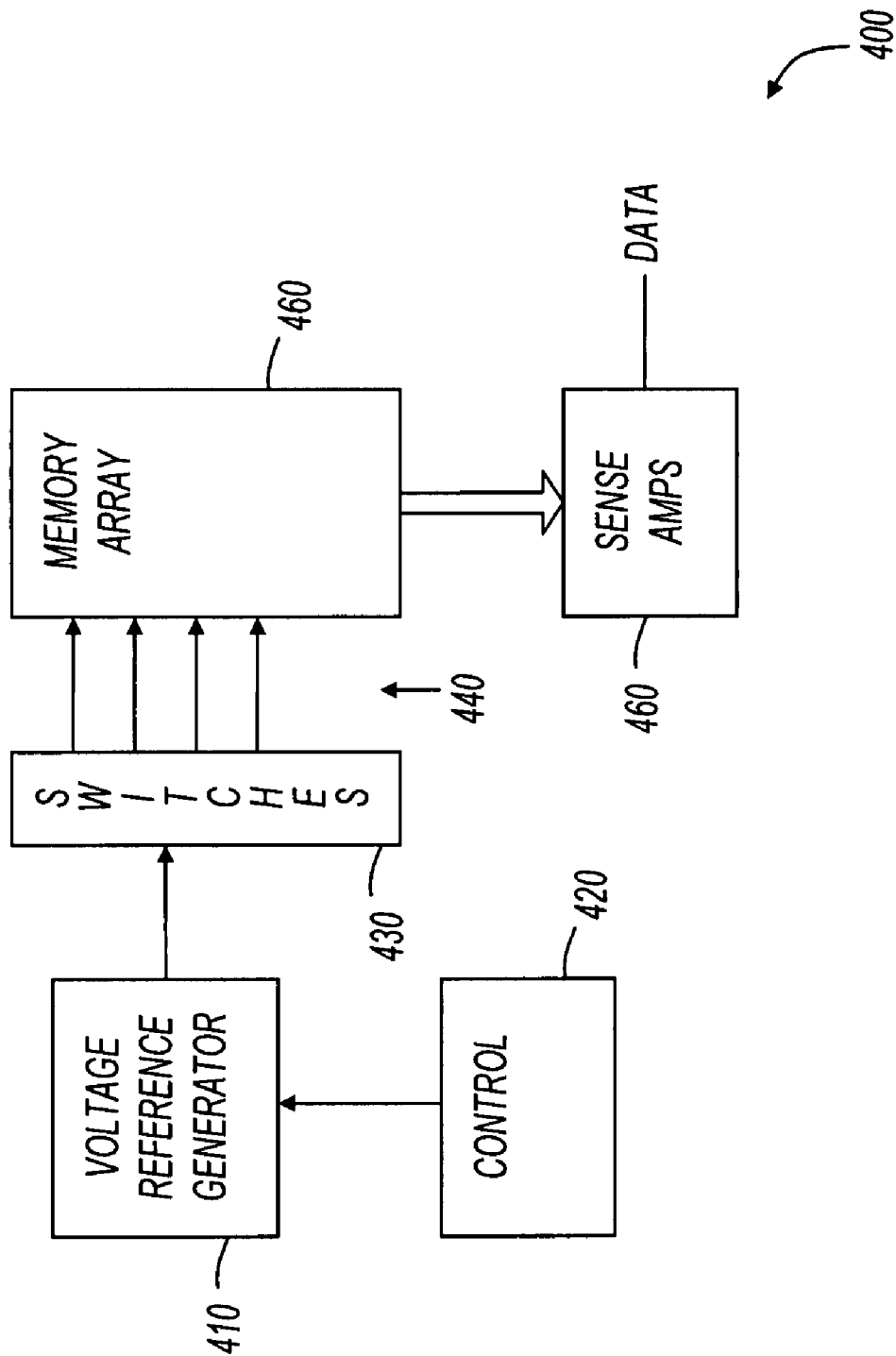
FIG. 4 shows a memory device.

FIG. 4 shows a memory device. Memory device 400 includes voltage reference generator 410, control block 420, switches 430, memory array 450, and sense amplifiers 460. In some embodiments, memory array 450 is a multi-level cell (MLC) array wherein each flash cell may be programmed with one of a number of possible threshold voltages, where each possible threshold voltage represents more than one bit of information.

Voltage reference generator 410 may be any voltage reference generator embodiment described herein, including voltage reference generator 100 (FIG. 1) Voltage reference generator 410 may produce a spiral voltage waveform such as waveform 200.

Switches 430 receive the spiral voltage waveform from voltage reference generator 410 and provide the waveform on wordlines 440. In some embodiments, switches 430 include decoding circuitry to determine which of wordlines 440 should be driven with the spiral waveform. Memory device 400 is shown with four wordlines, but this is not a limitation of the present invention. Any number of wordlines may be present. Further, any number of voltage reference generators may also be present.

In operation, control block 420 sequences voltage reference generator 410 through a spiral waveform, the appropriate wordlines are driven with the spiral waveform, and sense amplifiers 460 sense the output of memory array 450 at multiple locations in time as shown in FIG. 2. Control block 420 also sequences switches within voltage reference generator 410 to refresh reference voltages during standby operation. For example, control block 420 may sequence switches in accordance with the method described above with reference to FIG. 3.

In some embodiments, memory array 450 includes MLC flash cells, and voltage reference generator 410 also includes flash cells as reference devices. In these embodiments, the reference voltage characteristics track the array cell characteristics. For ease of illustration, portions of memory device 400 are not shown. Memory device 400 may include much more circuitry than illustrated in FIG. 4 without departing from the scope of the present invention.

Memory device 400 may be a packaged integrated circuit or an unpackaged integrated circuit die. For example, memory device 400 may be a packaged integrated circuit that includes an interface to allow it to be used as part of an electronic system. Also for example, memory device 400 may be included in a packaged integrated circuit that also includes other components, functional blocks, integrated circuit dice, or subsystems. Further, in some embodiments, memory device 400 may be sold as an unpackaged integrated circuit die.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A multi-level cell memory device comprising:
   a plurality of closed loop voltage references that include programmed flash cells, wherein reference voltages produced by the closed loop voltage references are controlled by threshold voltages of the flash cells; and
   a plurality of output stages, at least one of the plurality of output stages being a pull down output stage, and at least one of the plurality of output stages being a pull up output stage;
   wherein the pull down output stage comprises a p-channel current source transistor and a first sample and hold capacitor coupled to a gate node of the p-channel current source transistor, and a p-channel source follower transistor and a second sample and hold capacitor coupled to a gate node of the p-channel source follower transistor.

2. The multi-level cell memory device of claim 1 wherein the pull up output stage comprises an n-channel current source transistor and a third sample and hold capacitor coupled to a gate node of the n-channel current source transistor, and an n-channel source follower transistor and a fourth sample and hold capacitor coupled to a gate node of the n-channel source follower transistor.

3. The multi-level cell memory device of claim 1 further comprising load capacitors coupled to output nodes of the plurality of output stages.

4. The multi-level cell memory device of claim 3 further comprising switches to isolate the plurality of output stages from the load capacitors.

5. The multi-level cell memory device of claim 1 further comprising switches to isolate the plurality of closed loop voltage references from the plurality of output stages.

6. The multi-level cell memory device of claim 1 wherein each of the plurality of closed loop voltage references includes a flash cell and a source follower transistor, a gate node of the flash cell being coupled to a source node of the source follower transistor.

\* \* \* \* \*